US008373502B1

(12) United States Patent
Chen et al.

(10) Patent No.: US 8,373,502 B1
(45) Date of Patent: Feb. 12, 2013

(54) GM-C FILTER TUNING CIRCUIT BASED ON RELAXATION OSCILLATOR

(75) Inventors: Xiaoming Chen, Hong Kong (HK); Shuzuo Lou, Hong Kong (HK); Gang Qian, Hong Kong (HK); Wai Po Wong, Hong Kong (HK)

(73) Assignee: Hong Kong Applied Science and Technology Research Institute Company Limited, Hong Kong Science Park, Shatin, New Territories, Hong Kong (CN)

( * ) Notice: Subject to any disclaimer, the term of this patent is extended or adjusted under 35 U.S.C. 154(b) by 0 days.

(21) Appl. No.: 13/237,922

(22) Filed: Sep. 20, 2011

(51) Int. Cl.
*H03B 1/00* (2006.01)
*H03K 5/00* (2006.01)
*H04B 1/10* (2006.01)

(52) U.S. Cl. ........ 327/551; 327/552; 327/553; 327/554; 327/555; 327/556; 327/557; 327/558; 327/559

(58) Field of Classification Search ........... 327/551–559
See application file for complete search history.

(56) References Cited

U.S. PATENT DOCUMENTS

| | | | | |
|---|---|---|---|---|
| 5,194,831 A * | 3/1993 | Jackson | ........................ | 331/111 |
| 5,426,384 A * | 6/1995 | May | ................ | 327/52 |
| 6,111,467 A * | 8/2000 | Luo | ................ | 330/305 |
| 6,184,726 B1 * | 2/2001 | Haeberli et al. | ................ | 327/96 |
| 6,727,768 B1 * | 4/2004 | Dasgupta | ....................... | 331/143 |
| 7,209,000 B2 * | 4/2007 | Huijsing et al. | ................... | 330/9 |
| 7,239,197 B2 * | 7/2007 | Chen et al. | ..................... | 327/553 |
| 7,634,038 B1 * | 12/2009 | Hufford et al. | ................ | 375/376 |
| 2006/0176108 A1 * | 8/2006 | Huijsing et al. | ................... | 330/9 |
| 2006/0192613 A1 * | 8/2006 | Chen et al. | ..................... | 327/553 |
| 2011/0254621 A1 * | 10/2011 | Rice | ................................. | 330/9 |
| 2012/0112808 A1 * | 5/2012 | Yotsuji | ........................ | 327/156 |

* cited by examiner

*Primary Examiner* — Lincoln Donovan
*Assistant Examiner* — Adam Houston
(74) *Attorney, Agent, or Firm* — Ella Cheong Hong Kong; Margaret A. Burke; Sam T. Yip

(57) ABSTRACT

A relaxation oscillator for generating a first and a second oscillation signals, comprising: a reference-voltage providing circuit for providing a high and a low reference voltages; switches for directing the high and low reference voltages to inputs of a transconductance amplifier and a non-inverting input of a comparator; the transconductance amplifier for generating an output current with a value determined by its transconductance value, controlled by an input tuning voltage, and multiplied by its inputs' voltage difference; a capacitor connecting between the transconductance amplifier output and ground; and the comparator for generating a first and a second digital signals; wherein the first and second digital signals are digital control signals to the switches, and the first and second oscillation signal of the relaxation oscillator respectively; wherein the oscillation frequency of the relaxation oscillator is independent of the reference voltages, achieving accurate frequency turning, and simplifying the reference-voltage providing circuit.

5 Claims, 7 Drawing Sheets

GM-C FILTER TUNING CIRCUIT BASED ON RELAXATION OSCILLATOR

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates to a relaxation oscillator and a Gm-C filter tuning circuit that employs such relaxation oscillator. In particular, the present invention relates to an improved relaxation oscillator used in a Gm-C filter tuning circuit for filter bandwidth calibration with reduced sensitivity to variations in component parameters, power supply voltage and operating temperature, as well as reduced requirements on power consumption, and on chip area when implemented in an integrated circuit (IC).

BACKGROUND

In the design of ICs for processing analog signals, there is often a need to include reconfigurable analog filters, whose filter bandwidths are variable and adjustable according to given applications. Particularly, using reconfigurable analog filters is advantageous for implementing wireless communication receivers due to the following reasons. First, there is a trend in using a single receiver for communications with different wireless communication systems running under different standards (e.g., 3G, WiFi, WiMax), and radio signals under different standards have different signal bandwidths. Reception of these signals by a single receiver requires either multiple analog filters with different bandwidths, or a single analog filter which bandwidth can be tunable to match these different signal bandwidths. The latter approach results in a significant saving of chip area in the design of ICs. Second, there is an increasing use of variable-bandwidth assignment in mobile communication systems for supporting services with different quality requirements and also for optimizing the system capacity. In this assignment scheme, the bandwidth of the signal is variable and changes over time. This condition prompts the use of reconfigurable analog filters in the implementation of radio receivers.

A reconfigurable analog filter can be realized as a Gm-C filter. A tutorial overview on the Gm-C filter and its architectures can be found in E. Sanchez-Sinencio and J. Silva-Martinez, *CMOS transconductance amplifiers, architectures and active filters: a tutorial, IEEE Proceedings on Circuits, Devices and Systems*, vol. 147, no. 1, pp. 3-12, February 2000; the disclosure of which is incorporated herein by reference by its entirety. A Gm-C filter comprises a plurality of transconductance amplifiers and capacitors. A transconductance amplifier is to convert an input voltage or a voltage difference into a current with magnitude proportional to the input voltage or the voltage difference. The current-to-voltage ratio is known as the transconductance value. Usually, all or most of the transconductance amplifiers of a Gm-C filter share a common transconductance value. The bandwidth of the Gm-C filter can easily be tuned by adjusting this transconductance value. In IC realization, the transconductance value is made variable and is controlled by an external voltage source, referred herein to as a tuning voltage. Adjusting the tuning voltage to a desired value that in turn correctly set the filter bandwidth can be accomplished by the following technique.

A voltage controlled oscillator (VCO) is an oscillator which oscillation frequency is controlled by an external voltage source, herein referred to as control voltage. The VCO can be realized by transconductance amplifier(s) and capacitor(s) organized in certain form of feedback loop, with the transconductance amplifier(s) and the capacitor(s) being identical to the ones used in the Gm-C filter. The oscillation frequency of such VCO is related to the transconductance value of the transconductance amplifier(s) and the capacitance value of the capacitor(s) by a first relationship that can be derived according to the circuit theory.

The bandwidth of the Gm-C filter can then be determined by the same transconductance value and the same capacitance value based on a second relationship. The teaching of how to determine this second relationship is disclosed in Jaime E. Kardontchik, *Introduction to the Design of Transconductor-Capacitor Filters*, Springer, 1992; the disclosure of which is incorporated herein by reference by its entirety. It follows that by setting a certain oscillation frequency for the VCO, it leads to a corresponding filter bandwidth for the Gm-C filter. Corresponding transconductance value used for setting both the VCO frequency and the filter bandwidth can be obtained. A phase locked loop (PLL) can be used to align the VCO frequency with a reference frequency. The voltage used to control the VCO frequency can also be used as a tuning voltage to set the transconductance value of the transconductance amplifiers in the Gm-C filter. Note that the PLL is a tuning circuit for the Gm-C filter. The operating principles of PLLs and their circuits can be found in Donald R. Stephens, *Phase-Locked Loops for Wireless Communications: Digital, Analog and Optical Implementations*, Kluwer Academic Publishers, 2002, and in Floyd M. Gardner, *Phaselock Techniques*, John Wiley and Sons, 1979. The disclosures of both references are incorporated by reference herein by their entireties.

The IC implementation of a Gm-C filter tuning circuit imposes certain requirements. First, the setting of the filter bandwidth should be accurate and independent of the variation of IC component parameters, such as transconductance and capacitance values; the variation of the supply voltage provided to the IC; and the change in the operating temperature. Second, the circuit topology should be simple requiring less IC chip area in turn reducing the cost of mass manufacturing of the ICs. Third, the power consumption of the IC should be kept minimal. Conserving battery power is an important criterion for handheld portable communication devices such as mobile phones.

In U.S. Pat. No. 6,727,768, a VCO used in a tuning circuit for a Gm-C filter is disclosed. This VCO comprises six resistors with four different resistance values: $R_A$, $R_B$, $R_D$ and $R_E$. The VCO frequency then depends on $R_B*(R_E+2R_A)/(R_B+2R_D)/R_E$. The disadvantage of this dependency is that the sensitivity of the VCO frequency to the inaccuracy of these resistance values is large. Moreover, buffers or bypassing capacitors are required to stabilize the voltage references generated by the resistor network, thereby increasing the IC chip area and the power consumption.

U.S. Pat. No. 7,239,197 discloses a tuning circuit. In this circuit, however, a dedicated multi-phase clock generator is required, introducing uncertainty in the filter bandwidth due to phase inaccuracy. Also, certain reference voltages are involved in the charging and the discharge processes of capacitors. Small errors in these reference voltages can affect the oscillation frequency. Buffers or large bypassing capacitors are also required, hence increasing the IC chip area.

U.S. Patent Application No. 2007/0096798 discloses another tuning circuit. The peak detector therein (i.e. the phase frequency detector) comprises two fully differential comparators, which consume a substantial amount of power and IC chip area. Moreover, the tuning voltage generated by the tuning circuit is proportional to an expression dependent on certain reference voltages, and tuning error can occur when these reference voltages drift due to die-to-die variation in component parameters, and variations in supply voltage and temperature.

In Y. H. Kim and H. K. Yu, *Automatic tuning circuit for Gm-C filters and published in the* 12*th IEEE International Conference on Electronics*, 2005, a tuning circuit is disclosed. In this tuning circuit, the VCO frequency depends on a supply voltage and a number of resistors. As a result, the tuning voltage is highly sensitive to the variations in the supply voltage and the resistors. The two transconductance amplifiers used also increase the IC chip area.

In U.S. Pat. No. 7,863,945, the oscillation frequency of the VCO depends on the resistance values of a plurality of resistors. It follows that variation in component parameters can have a profound effect on the accuracy of the oscillation frequency.

As can be seen in current state of the art, there is a need for an improved tuning circuits that fulfill the aforementioned three requirements: (1) robustness against variations in IC component parameters, supply voltage, and operating temperature, (2) minimal IC chip area implementation, and (3) low power consumption.

SUMMARY

In accordance to one embodiment of the presently disclosed invention, a relaxation oscillator is used as the VCO in a Gm-C filter tuning circuit. The presently disclosed relaxation oscillator has the advantage of robustness against variations in IC component parameters, supply voltage, and operating temperature. It also has the additional advantages of having a small IC chip area and low power consumption. These advantages carry over to a Gm-C filter tuning circuit that incorporates the disclosed relaxation oscillator. Thus, the resultant Gm-C filter tuning circuit fulfills the three aforementioned requirements.

In accordance to another embodiment of the presently disclosed invention, the presently disclosed relaxation oscillator can also be used as the VCO in a PLL-based Gm-C filter tuning circuit.

BRIEF DESCRIPTION OF THE DRAWINGS

Embodiments of the invention are described in more detail hereinafter with reference to the drawings, in which.

DETAILED DESCRIPTION

Figure 1B:
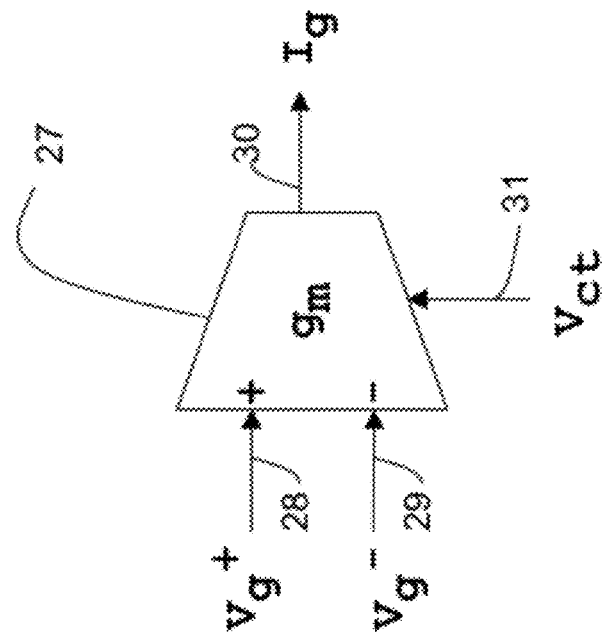
FIG. 1B depicts a symbolic representation of another transconductance amplifier that has three inputs but only one output.

In the following description, a relaxation oscillator circuit and a Gm-C filter circuit based on the relaxation oscillator is disclosed. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

A transconductance amplifier can have one or two outputs. FIG. 1A shows a symbolic representation of a two-output transconductance amplifier 21, having three inputs and two outputs. The three inputs are a non-inverting input 22, an inverting input 23, and a tuning-voltage input 26. The two outputs are a non-inverting output 24 and an inverting output 25. The tuning-voltage input 26 is supplied with a tuning voltage, $V_{ct}$, for controlling the transconductance value, $g_m$, of the amplifier 21. The non-inverting input 22 and the inverting input 23 are supplied with a voltage, $V_g^+$, and a voltage, $V_g^-$, respectively. The function of the amplifier 21 is to provide an output current, $I_g^+$ flowing out from the non-inverting output 24 with its value determined by $I_g^+=(V_g^+-V_g^-)\times g_m$. Another output current, $I_g^-$, flowing out from the inverting output 25 which value is determined by $I_g^-=-I_g^+$.

Figure 1A:
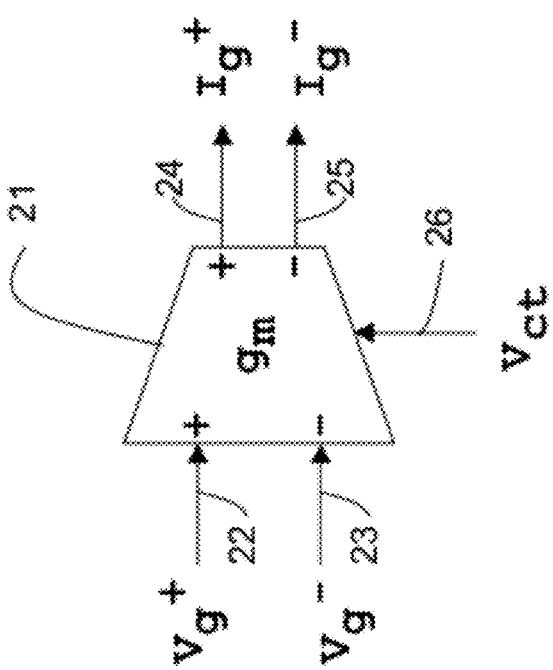
FIG. 1A depicts a symbolic representation of a transconductance amplifier that has three inputs and two outputs.

FIG. 1B shows a symbolic representation of a single-output transconductance amplifier 27. A non-inverting input 28 is supplied with a voltage, $V_g^+$, while an inverting input 29 is supplied with another voltage, $V_g^-$. A tuning-voltage input 31 is presented with a tuning voltage, $V_{ct}$, for controlling the transconductance value, $g_m$, of the amplifier 27. The output current, $I_g$, flowing out from an output 30 has a value determined by $I_g=(V_g^+-V_g^-)\times g_m$. The transconductance amplifier covered by the scope of this invention has either one or two outputs.

Figure 1C:
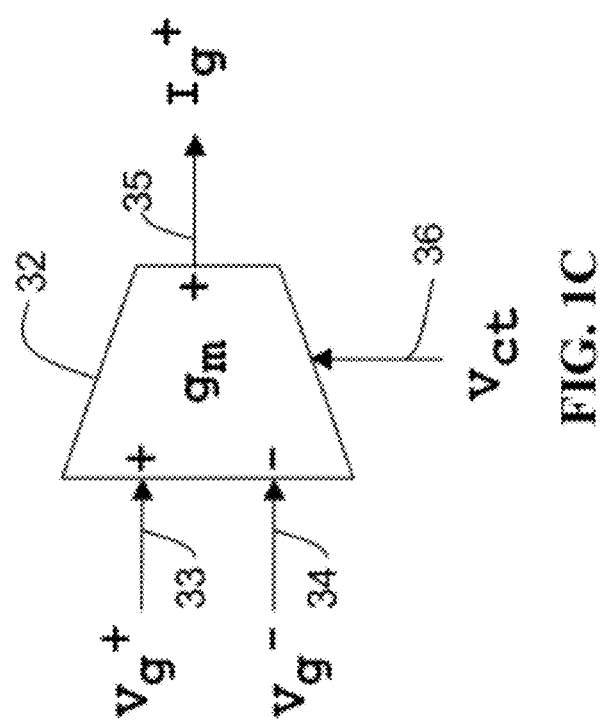
FIG. 1C depicts a symbol used herein to represent a transconductance amplifier that has either two outputs or just one output.

FIG. 1C shows a symbolic representation of a transconductance amplifier 32. This symbolic representation is used hereinafter to refer to a transconductance amplifier having either one or two outputs. Three inputs of the amplifier 32: a non-inverting input 33, an inverting input 34, and a tuning-voltage input 36, are the same as the corresponding ones used in the two-output transconductance amplifier 21 and the one-output transconductance amplifier 27. An output 35 produces a current, $I_g^+$, which value is determined by $I_g^+=(V_g^+-V_g^-)\times g_m$. The output 35 is equivalent to the output 30 of the single-output transconductance amplifier 27 with $I_g$ given by $I_g^+$. This output 35 is also equivalent to $(I_g^+-I_g^-)$ of the two-output transconductance amplifier 21.

Relaxation Oscillator:

The structure of one embodiment of the presently disclosed relaxation oscillator is detailed as follows with the aid of FIG. 2, which shows a circuit diagram of such relaxation oscillator.

A first reference voltage $V_H$ and a second reference voltage $V_L$ are provided by a reference-voltage providing circuit 40, where the voltage $V_H$ is higher than the voltage $V_L$. The reference voltages $V_H$ and $V_L$ are fed to a plurality of switches S1, S2, S3, S4, S5, and S6. Each of the switches has a first terminal and a second terminal, and receives a digital control signal. In addition, each of the switches is configured to establish an electrical connection between the first terminal and the second terminal when the digital control signal has a value of LOGICAL 1, and is configured to disconnect the first terminal and the second terminal when the digital control signal has a value of LOGICAL 0.

Figure 2:
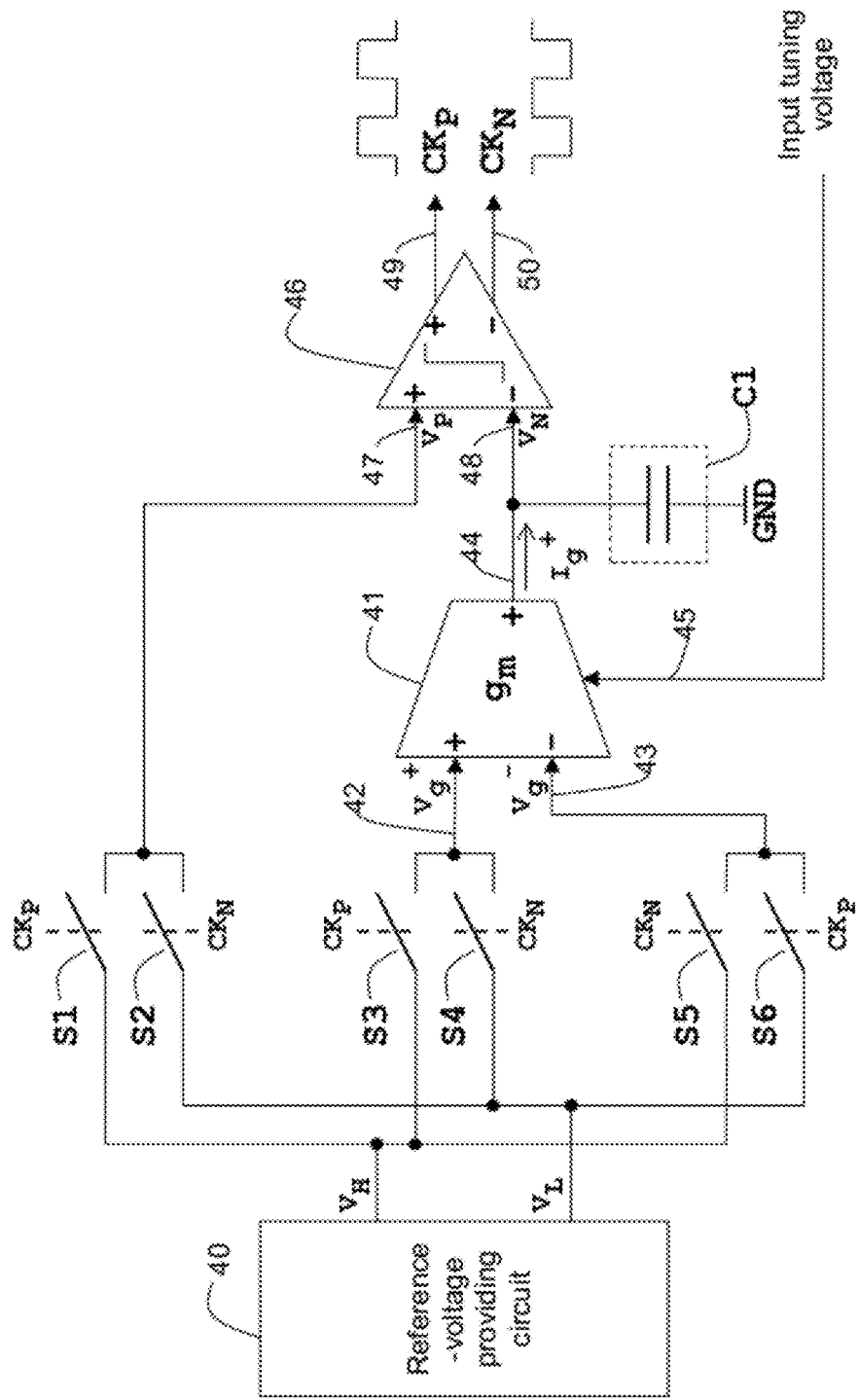
FIG. 2 shows a circuit diagram of a relaxation oscillator in accordance to an embodiment of the presently disclosed invention.

Referring to FIG. 2. In IC implementation, the switches S1-S6 can be realized as n-channel MOSFETs. In an n-channel MOSFET, the drain can be the first terminal and the source can be the second terminal, or vice versa with the source being the first terminal and the drain being the second terminal. The digital control signal is applied to the gate, provided that a LOGICAL 1 is corresponding to a high voltage that is approximate to a positive supply voltage. When the digital control signal has a value of LOGICAL 1, the gate is positively biased so that the drain and the source of an n-channel MOSFET are connected.

Still referring to FIG. 2. Under the same condition that a LOGICAL 1 is corresponding to a high voltage that is approximate to a positive supply voltage, another realization of any one of the switches S1-S6 is a p-channel MOSFET, wherein the source of the p-channel MOSFET is the first terminal, the drain is the second terminal. A p-channel MOSFET switch works similarly as an n-channel MOSFET switch except that a p-channel MOSFET switch's source and drain are connected with a LOGICAL 0 is applied at its gate. Therefore, an inverter is inserted between the control voltage and the p-channel MOSFET gate, the output of the inverter is connected to the gate of the p-channel MOSFET, and the digital control signal is applied to the input of the inverter. When the digital control signal has a value of LOGICAL 1, the output of the inverter gives a LOGICAL 0, which has a voltage value approximating the electrical GROUND, so that the channel of the p-channel MOSFET is at the on position.

Still referring to FIG. 2. The first terminals of the switches S1, S3, and S5 are connected to the voltage $V_H$, and the first terminals of the switches S2, S4, and S6 are connected to the voltage $V_L$. The second terminals of the switches S3 and S4 are connected to a non-inverting input 42 of a transconductance amplifier 41, and the second terminals of the switches S5 and S6 are connected to an inverting input 43 of this amplifier 41. The transconductance value of the transconductance amplifier 41 is variable and is controllable by an input tuning voltage applied at a tuning-voltage input 45 of this amplifier 41, wherein the input tuning voltage is an external voltage feeding to the presently disclosed relaxation oscillator. The function of the transconductance amplifier 41, as described in the above, is to produce an output current at an output 44 where the current is proportional to the voltage difference between the non-inverting input 42 and the inverting input 43. A capacitor C1 is connected between the output 44 of the transconductance amplifier 41 and the electrical GROUND. The output 44 is further connected to an inverting input 48 of a comparator 46. A non-inverting input 47 of the comparator 46 is connected to the second terminals of the switches S1 and S2. The comparator 46 generates a first digital signal at a non-inverting output 49 and a second digital signal at an inverting output 50 such that: a LOGICAL 1 is produced at the non-inverting output 49 when the voltage difference between the non-inverting input 47 and the inverting input 48 is substantially positive; a LOGICAL 0 is given at the non-inverting output 49 when such voltage difference is substantially negative; and the second digital signal 50 is a logical complement of the first digital signal 49. The first digital signal is used as digital control signals for the switches S1, S3, and S6; and the second digital signal is used as digital control signals for the switches S2, S4, and S5. The first and the second digital signals are the first and the second oscillation signals, respectively, produced by the disclosed relaxation oscillator.

Figure 3:
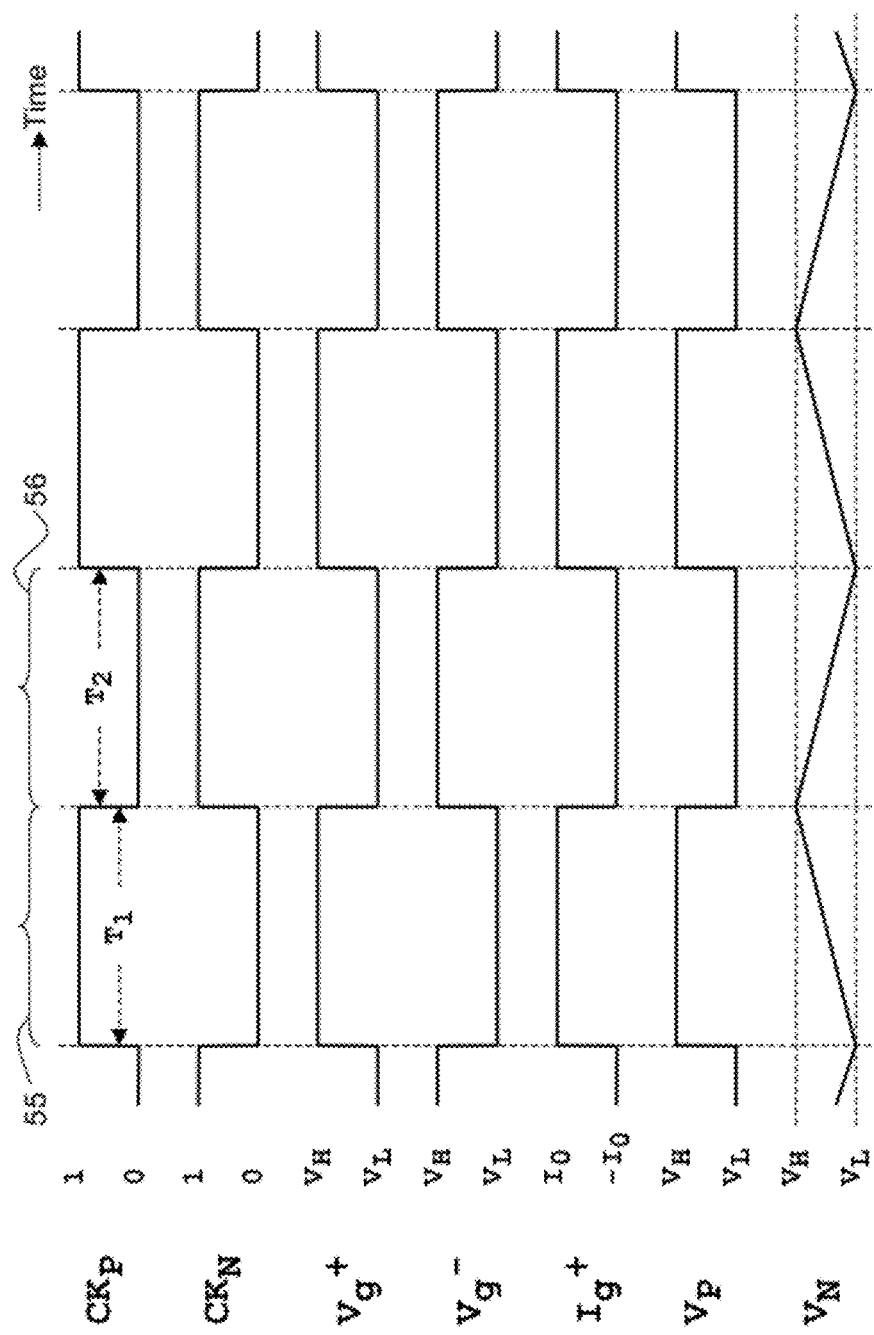
FIG. 3 shows the voltage/current waveforms of a plurality of selected nodes in the circuit of the presently disclosed relaxation oscillator.

The operation principle of the disclosed relaxation oscillator is elaborated as follows. FIG. 3 shows the voltage/current waveforms at selected nodes in the circuit shown in FIG. 2. In FIG. 2 and FIG. 3, $CK_P$ denotes the first digital signal, $CK_N$ denotes the second digital signal, $V_g^+$ denotes the voltage at the non-inverting input 42 of the transconductance amplifier 41, $V_g^-$ denotes the voltage at the inverting input 43 of the transconductance amplifier 41, $I_g^+$ denotes the output current flowing out from the output 44 of the transconductance amplifier 41, $I_0$ denotes the magnitude of $I_g^+$, $V_P$ denotes the voltage at the non-inverting input 47 of the comparator 46, and $V_N$ denotes the voltage observed at the inverting input 48 of this comparator 46. The first half period 55 is of length $T_1$, and the second half period 56 occupies a time of $T_2$. Without loss of generality, during the first half period 55, $CK_P$ is LOGICAL 1 and $CK_N$ takes the value of LOGICAL 0. Hence, the switches S1, S3, and S6 are closed and the switches S2, S4, and S5 are open. It follows that $V_g^+=V_H$, $V_g^-=V_L$, and $V_P=V_H$. The output current $I_g^+$, computed by $I_g^+=(V_g^+-V_g^-) \times g_m$ for a transconductance value $g_m$, is then determined by $I_g^+=I_0$ where $I_0=(V_H-V_L) \times g_m$. In the first half period 55, $V_P$ must be greater than $V_N$; otherwise $CK_P$ would be forced to be LOGICAL 0. Therefore, at the starting instant of the first half period 55, $V_N$ has the voltage of $V_L$.

Referring to FIG. 2 and FIG. 3. The capacitor C1 stores/dissipates the charge supplied/withdrawn from the current $I_g^+$ (depending on the sign of the current) so that $V_N$ is increased or decreased accordingly. According to the circuit theory, the voltage $V_N$ at time t, denoted as $V_N(t)$, is given by:

$$V_N(t) = V_L + \frac{1}{C}\int_0^t I_g^+ dt = V_L + \frac{1}{C}\int_0^t I_0 dt = V_L + \frac{1}{C}g_m(V_H - V_L)t$$

where C is the capacitance of the capacitor C1. At $t=T_1$, the voltage $V_N(t)$ reaches $V_H$. It follows that $V_N(T_1)=V_H$ and hence:

$$T_1 = \frac{C}{g_m}.$$

At the instant immediately after $t=T_1$, the voltage $V_N(t)$ starts to exceed $V_P$, where $V_P=V_H$. It follows that the comparator 46 switches $CK_P$ from LOGICAL 1 to LOGICAL 0, and accordingly, $CK_N$ from LOGICAL 0 to LOGICAL 1. It marks the beginning of the second half period 56. During the second half period 56, the switches S1, S3, and S6 are open, and the switches S2, S4, and S5 are closed. Therefore, $V_g^+=V_L$, $V_g^-=V_H$, and $V_P=V_L$. According to the formula: $I_g^+=(V_g^+-V_g^-) \times g_m$, the output current $I_g^+$ is given by $I_g^+=-I_0$. Since $V_N(T_1)=V_H$, the voltage $V_N(t)$ for $T_1 < t \leq T_1+T_2$ is given by:

$$V_N(t) =$$

$$V_H + \frac{1}{C}\int_{T_1}^{t} I_g^+ dt = V_H - \frac{1}{C}\int_{T_1}^{t} I_0 dt = V_H - \frac{1}{C}g_m(V_H - V_L)(t - T_1).$$

Note that during the period $T_1 < t \leq T_1 + T_2$, the voltage $V_N(t)$ decreases as t increases. At $t = T_1 + T_2$, the voltage $V_N(t)$ drops to $V_L$, reaching the voltage $V_P = V_L$ which will trigger the switching of the outputs $CK_P$ and $CK_N$ of the comparator 46. Substituting $t = T_1 + T_2$ into the above formula for $V_N(t)$ and noting that $V_N(T_1 + T_2) = V_L$ yields:

$$T_2 = \frac{C}{g_m}.$$

At the instant just after $t = T_1 + T_2$, $CK_P$ becomes LOGICAL 1 and $CK_N$ changes to LOGICAL 0. The two conditions for the first half period 55 emerge again, and the aforementioned processes for the transconductance amplifier 41 and the comparator 46 repeat; thus, oscillation occurs.

The oscillation frequency of the disclosed relaxation oscillator, $f_{osc}$, is given by:

$$f_{osc} = \frac{1}{T_1 + T_2} = \frac{g_m}{2C}.$$

It can be seen that $f_{osc}$ depends on $g_m$ and C only but not on $V_H$ and $V_L$. Typically, $V_H$ and $V_L$ are generated by a circuit connected to a power supply and comprised of electronic components such as transistors and resistors. The accuracy of the voltage levels generated for $V_H$ and $V_L$ is affected by the accuracy of the component parameters and also by the voltage fluctuation of the power supply. Because the oscillation frequency is independent of $V_H$ and $V_L$, variation of component parameters among different semiconductor dice during IC fabrication process and variation in the power supply voltage do not affect the setting of the Gm-C filter bandwidth. Changing operating temperature, however, does affect the relationship between the value of $g_m$ and the tuning voltage. Nonetheless, since the $g_m$ value of the transconductance amplifier used in the presently disclosed relaxation oscillator and the one in the Gm-C filter are matched, the effect of changing operating temperature is reflected on the changes in the tuning voltage. The $g_m$ value that determines the oscillation frequency $f_{osc}$ remains the same. Therefore, the setting of the Gm-C filter bandwidth is robust to operating temperature. Lastly, since $f_{osc}$ does not depend on the power supply voltage, the setting of the Gm-C filter bandwidth is also robust to variation in the supply voltage.

Referring to FIG. 2. Additional features and their advantages of the presently disclosed relaxation oscillator are described as follows. One embodiment of the presently disclosed relaxation oscillator comprises the reference-voltage providing circuit 40, six switches, one transconductance amplifier, one capacitor and one comparator. As $f_{osc}$ does not depend on $V_H$ and $V_L$, the accuracy requirement on these two reference voltages is relaxed. It offers a significant advantage in that a simple circuit is sufficient to be used for the reference-voltage providing circuit 40. Owing to a small of number of components used in the relaxation oscillator, another advantage is the small power consumption.

Figure 4:
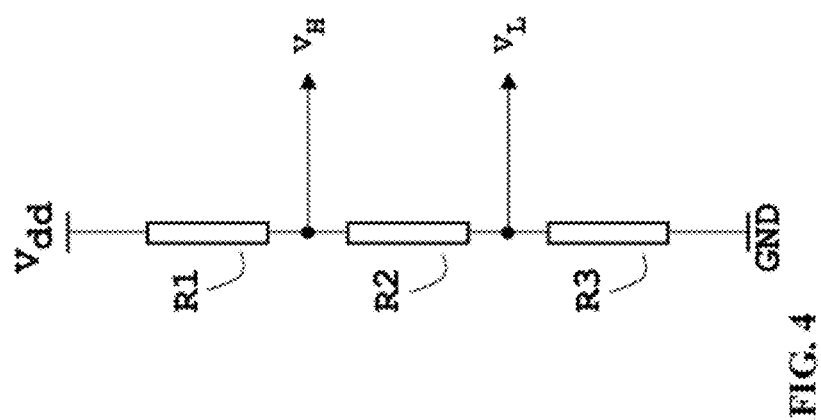
FIG. 4 shows circuit diagram of an exemplary circuit used for a reference-voltage providing circuit in the presently disclosed relaxation oscillator.

FIG. 4 shows an exemplary embodiment of the reference-voltage providing circuit 40. This circuit employs a series connection of resistors R1, R2, and R3 to generate the first reference voltage $V_H$ and the second reference voltage $V_L$ from a positive voltage supply $V_{dd}$. In this circuit, a first terminal of the resistor R1 is connected to the positive voltage supply $V_{dd}$, a second terminal of the resistor R1 is connected to a first terminal of the resistor R2, a second terminal of the resistor R2 is connected to a first terminal of the resistor R3, and a second terminal of the resistor R3 is connected to the GROUND. The first reference voltage $V_H$ is the voltage obtained at the second terminal of the resistor R1, and the second reference voltage $V_L$ is the voltage obtained at the second terminal of the resistor R2. It follows that $V_H$ and $V_L$ are given by:

$$V_H = \frac{R2 + R3}{R1 + R2 + R3} V_{dd}$$

and $$V_L = \frac{R3}{R1 + R2 + R3} V_{dd},$$

respectively, indicating that $V_H$ is higher than $V_L$ for the resistor R2, which has a non-zero resistance.

Figure 5:
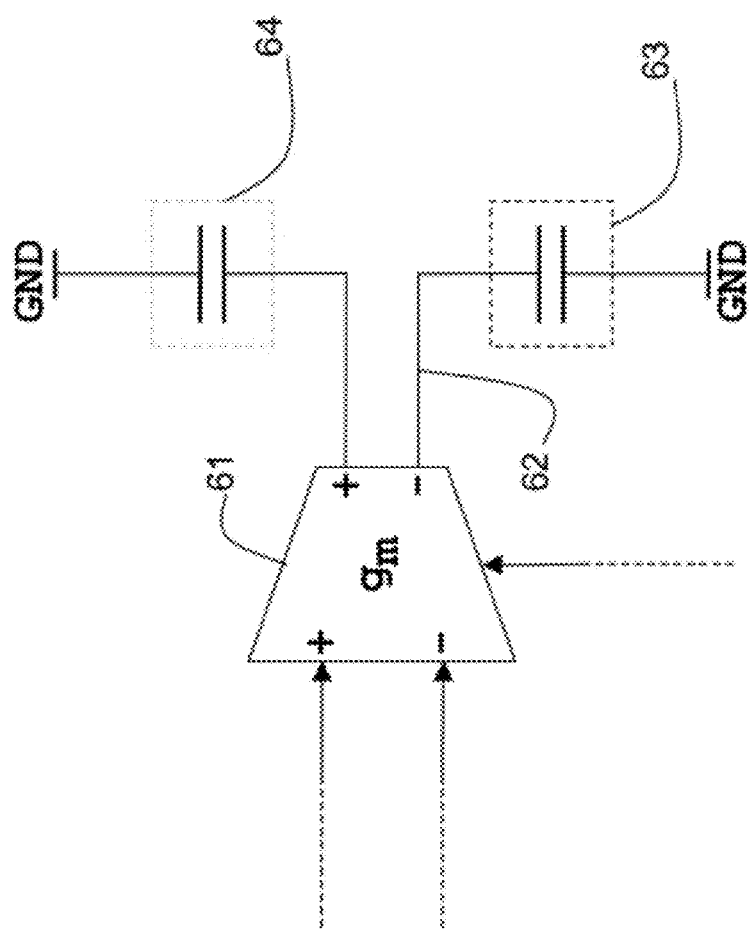
FIG. 5 depicts the arrangement for a differential-output transconductance amplifier with only one output utilized.

As stated above, the transconductance amplifier 41 usually have two outputs. But only non-inverting output is used. For a better matching at the outputs, the arrangements of the connection to the inverting output should be the same as non-inverting output, as depicted in FIG. 5. The capacitor 63 and capacitor 64 have the same value and capacitor 63 and capacitor 64 are MOS capacitor, which match the one used in the corresponding Gm-C filter.

In the art, the comparator 46 can be realized by an electronic circuit that optionally includes a hysteresis in the input-output relationship in order to mitigate the undesirable effects of input noise. An example of such electronic circuit is disclosed in U.S. Pat. No. 6,741,112.

Figure 6:
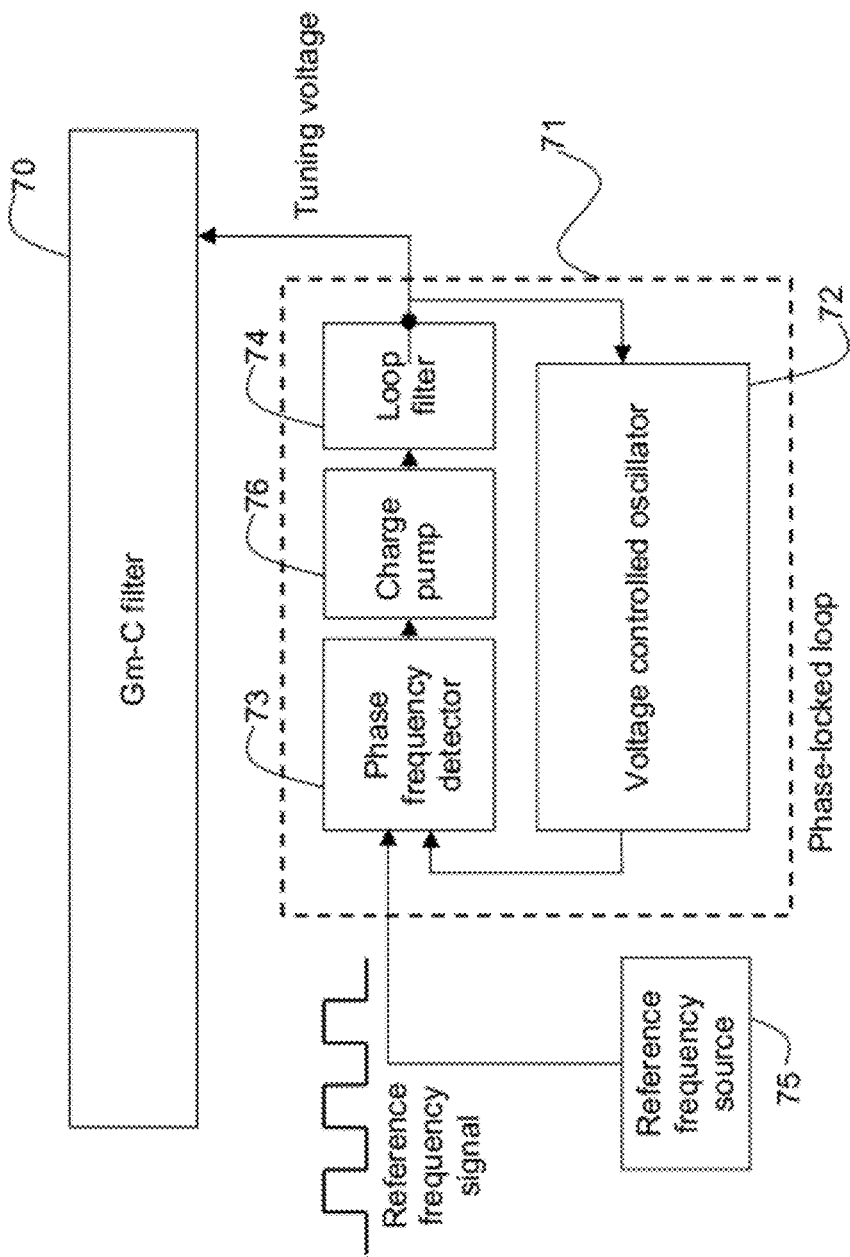
FIG. 6 depicts a tuning circuit for a Gm-C filter. This tuning circuit is a PLL with a VCO comprising a duplication of the transconductance amplifier and the capacitor used in the Gm-C filter. Furthermore, the VCO is realized by the disclosed relaxation oscillator.

PLL-Based Gm-C Filter Tuning Circuit with a Relaxation Oscillator VCO:

Based on the presently disclosed relaxation oscillator, one embodiment of a Gm-C filter tuning circuit is disclosed as follows. This embodiment of a Gm-C filter tuning circuit is realized as a PLL using the presently disclosed relaxation oscillator as its VCO. FIG. 6 depicts a block-diagram structure of the tuning circuit. A PLL 71 is used as the tuning circuit. The PLL 71 comprises a VCO 72, a phase frequency detector 73, a charge pump, and a low pass filter (LPF) 74. The VCO 72 comprises a duplication of the transconductance amplifier and the capacitor used in a Gm-C filter 70. In particular, the VCO 72 is realized by the presently disclosed relaxation oscillator. Either $CK_P$ or $CK_N$ of the relaxation oscillator can be selected as an output signal of the VCO 72. The output signal of the VCO 72 is fed to an input of the phase frequency detector 73. Another input of the phase frequency detector 73 is connected to a reference frequency source 75 for receiving a reference frequency signal. The function of the phase frequency detector 73 is to provide a digital output signal by comparing the phases between the reference frequency signal and the output signal of the VCO 72. The digital output signal of the phase frequency detector 73 is fed to the charge pump, which is to provide the loop gain for the PLL, and smoothed out by the LPF 74, which produces an analog output voltage at its output. This analog output voltage is used as the input tuning voltage for the relaxation oscillator that realizes the VCO 72, such that the oscillation frequency of the VCO 72 is aligned with the frequency of the reference frequency signal. The analog output voltage of the LPF 74 is also supplied to the Gm-C filter 70, which is external to the PLL 71, and used as the tuning voltage for controlling the transconductance value of at least one transconductance amplifier in the Gm-C filter 70.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A relaxation oscillator for generating a first oscillation signal and a second oscillation signal, comprising:
    a reference-voltage providing circuit for providing a first reference voltage and a second reference voltage, wherein the first reference voltage being higher than the second reference voltage;
    a first switch, a second switch, a third switch, a fourth switch, a fifth switch and a sixth switch, each receiving a digital control signal, having a first terminal and a second terminal, configured to establish an electrical connection between the first terminal and the second terminal when the digital control signal having a value of logical 1, and to disconnect the first terminal from the second terminal when the digital control signal having a value of logical 0, wherein the first terminals of the first, third and fifth switches are connected to the first reference voltage, and the first terminals of the second, fourth and sixth switches are connected to the second reference voltage;
    a transconductance amplifier having a non-inverting input, an inverting input, a tuning-voltage input and an output, for generating an output current at the output with a current value determined by a transconductance value of the transconductance amplifier multiplied by the voltage difference between the non-inverting input and the inverting input, wherein the non-inverting input is connected to the second terminals of the third and fourth switches, the inverting input is connected to the second terminals of the fifth and sixth switches, and wherein the transconductance value is variable and is controlled by an external input tuning voltage applied at the tuning-voltage input;
    a capacitor connecting between the output of the transconductance amplifier and an electrical ground; and
    a comparator having a non-inverting input, an inverting input, a non-inverting output and an inverting output, for generating a first digital signal at the non-inverting output and a second digital signal at the inverting output, wherein the non-inverting input is connected to the second terminals of the first and second switches, and the inverting input is connected to the output of the transconductance amplifier;
    wherein the first digital signal having a logical 1 value when the voltage difference between the non-inverting input of the comparator and the inverting input of the comparator being positive, and a logical 0 value when the voltage difference between the non-inverting input of the comparator and the inverting input of the comparator being negative;
    wherein the first digital signal is the digital control signals for the first, the third, and the sixth switches;
    wherein the second digital signal is the digital control signals for the second, the fourth, and the fifth switches;
    wherein the first digital signal is the first oscillation signal of the relaxation oscillator; and
    wherein the second digital signal is the second oscillation signal of the relaxation oscillator.

2. The relaxation oscillator of claim 1, the reference-voltage providing circuit comprising:
    a first resistor, a second resistor, and a third resistor for generating the first reference voltage and the second reference voltage from a positive voltage supply;
    wherein a first terminal of the first resistor is connected to the positive voltage supply;
    wherein a second terminal of the first resistor is connected to a first terminal of the second resistor;
    wherein a second terminal of the second resistor is connected to a first terminal of the third resistor;
    wherein a second terminal of the third resistor is connected to an electrical ground; and
    wherein the first reference voltage is obtained at the second terminal of the first resistor, and the second reference voltage is obtained at the second terminal of the second resistor.

3. The relaxation oscillator of claim 1, wherein the output of the transconductance amplifier is a non-inverting output, and the output current of the transconductance amplifier is a first output current; and
    wherein the transconductance amplifier further comprises an inverting output for delivering a second output current, the second output current having a magnitude equals to the first output current and an opposite current flow direction.

4. The relaxation oscillator of claim 1, wherein the comparator is further characterized by an input-output relationship having a hysteresis.

5. A phase locked loop (PLL) based Gm-C filter tuning circuit for generating a tuning voltage for controlling the transconductance value of at least one transconductance amplifier external to the Gm-C filter tuning circuit, the Gm-C filter tuning circuit comprising:
    the relaxation oscillator of claim 1 for generating an output oscillation signal;
    a phase frequency detector for generating a digital output signal by comparing the phases between an input reference frequency signal and the output oscillation signal generated by the relaxation oscillator;
    a charge pump for providing loop gain; and
    a low pass filter (LPF) for generating an analog output signal by smoothing out the digital output signal generated by the charge pump;
    wherein the analog output signal generated by the LPF is fed to the relaxation oscillator as input tuning voltage to the relaxation oscillator; and
    wherein the analog output signal generated by the LPF is the tuning voltage for controlling the transconductance value of at least one transconductance amplifier external to the Gm-C filter tuning circuit.

* * * * *